(12) United States Patent
Alexander et al.

(10) Patent No.: US 7,734,980 B2
(45) Date of Patent: Jun. 8, 2010

(54) MITIGATING SILENT DATA CORRUPTION IN A BUFFERED MEMORY MODULE ARCHITECTURE

(75) Inventors: James W. Alexander, Aloha, OR (US); Suresh Chittor, Beaverton, OR (US); Dennis W. Brzezinski, Sunnyvale, OR (US); Kai Cheng, Portland, OR (US); Rajat Agarwal, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 723 days.

(21) Appl. No.: 11/165,693

(22) Filed: Jun. 24, 2005

(65) Prior Publication Data
US 2007/0011562 A1    Jan. 11, 2007

(51) Int. Cl.
*H03M 13/00*    (2006.01)
*G11C 29/00*    (2006.01)

(52) U.S. Cl. .................. 714/751; 714/773; 714/774

(58) Field of Classification Search .............. 714/751, 714/773, 774
See application file for complete search history.

(56) References Cited

U.S. PATENT DOCUMENTS

| | | | | |
|---|---|---|---|---|
| 4,775,978 A | * | 10/1988 | Hartness | 714/770 |
| 5,127,014 A | * | 6/1992 | Raynham | 714/754 |
| RE34,100 E | * | 10/1992 | Hartness | 714/769 |
| 5,233,614 A | * | 8/1993 | Singh | 714/723 |
| 5,289,478 A | * | 2/1994 | Barlow et al. | 714/770 |
| 5,629,948 A | * | 5/1997 | Hagiwara et al. | 714/748 |
| 6,493,843 B1 | * | 12/2002 | Raynham | 714/763 |

OTHER PUBLICATIONS

U.S. Appl. No. 10/456,353, filed Jun. 5, 2003, Vogt et al.
Vogt, "Fully-Buffered DIMM Technology Moves Enterprise Platforms to the Next Level" Technology@IntelMagazine Mar. 2005, p. 1-7.
Mukherjee, "The Soft Error Problem: An Architectural Perspective" IEEE 1530-0897-05 2005.

* cited by examiner

*Primary Examiner*—Joseph D Torres
(74) *Attorney, Agent, or Firm*—Blakely, Sokoloff, Taylor & Zafman LLP (57) ABSTRACT

Embodiments of the invention are generally directed to systems, apparatuses, and methods for mitigating silent data corruption in a fully-buffered memory module architecture. In an embodiment, a memory controller includes a memory channel bit-lane error detector having an M-bit CRC and N-bit CRC, wherein N is less than M. The N-bit CRC is used if at least one bit-lane of the memory channel fails. In one embodiment, the memory controller selectively applies the strong error detection capability of an error correction code (ECC) in combination with the N-bit CRC to signal the need to resend faulty data, if at least one bit-channel has failed. Other embodiments are described and claimed.

27 Claims, 7 Drawing Sheets

| CASE | CRC-M | ECC | ACTION |
|---|---|---|---|
| A) | OK | OK | FWD |
| B) | OK | CORR | CORR,SCRUB,FWD |
| Pre Retry C₁) | OK | UNCORR | RETRY |
| Pre Retry D₁) | FWD | N/A | RETRY |
| Post Retry C₂) | OK | A, B | A, B |
| Post Retry C₃) | OK | UNCORR | POISON, FWD |
| Post Retry D₂) | BAD | N/A | POISON, FWD |

| CASE | CRC-N | ECC | ACTION |
|---|---|---|---|
| A) | OK | OK | FWD |
| B) | OK | CORR | RETRY (706) |
| Pre Retry C₁) | OK | UNCORR | RETRY |
| Pre Retry D₁) | BAD | N/A | RETRY |
| C₂) | OK | AB | AB |
| C₃) | OK | UNCORR | POISON,AB |
| D₂) | BAD | N/A | POISON,AB |

MITIGATING SILENT DATA CORRUPTION IN A BUFFERED MEMORY MODULE ARCHITECTURE

TECHNICAL FIELD

Embodiments of the invention generally relate to the field of computer memory and, more particularly, to systems, apparatuses, and methods for mitigating silent data corruption in a buffered memory module architecture.

BACKGROUND

Memory content errors can be classified as either persistent (or permanent) errors and transient (or soft) errors. Persistent errors are typically caused by physical malfunctions such as the failure of a memory device or the failure of a socket contact. Transient errors, on the other hand, are usually caused by energetic particles (e.g., neutrons) passing through a semiconductor device, or by signaling errors that generate faulty bits at the receiver. These errors are called transient (or soft) errors because they do not reflect a permanent failure. A "faulty bit" refers to a bit that has been corrupted by a memory content or signaling error.

A soft error does not always affect the outcome of a program. For example, a memory system may not read a faulty bit. Also, many memory systems include error detection and/or error correction mechanisms that can detect and/or correct a faulty bit (or bits). These mechanisms typically involve adding redundant information to data to protect it against faults. One example of an error detection mechanism is a cyclic redundancy code (CRC). An example of an error correction mechanism is an error correction code (ECC).

Some soft errors, however, can affect the outcome of a program. A faulty bit that is detected by a CRC or an ECC may still affect the outcome of a program if the error cannot be corrected. A more insidious type of soft error, is one that is not detected by the memory system. A soft error may escape detection if the system does not have error detection hardware that covers a specific faulty bit, and then that data bit is used by the system. Also, some faulty bits have errors that are weighted beyond the specification of the error protection mechanism used to detect them. The term "silent data corruption" (SDC) refers to an error that is not detected and affects program outcome.

The frequency that a system exhibits soft errors (e.g., the soft error rate (SER)) is typically expressed in failures in time (FIT). One FIT signifies one error in a billion hours. Memory systems are designed to operate within a specified FIT budget. There are a number of factors that can potentially impact a system's FIT budget.

Memory channels allocate some number of signaling bit-lanes to transfer data bits, and some number of bit-lanes to transfer error detection and correction bits. In general, a reduction in the number of bit-lanes in a memory channel leads to an increase in the exposure to silent data corruption. The reason for this is that the loss of a bit-lane causes a reduction in the amount of correction data that can be added to a packet of data sent through the memory channel. Typically, the amount of correction data added to a packet sent over a memory channel cannot be increased to compensate for a failed bit-lane because memory channels are designed to maintain short and precise round-trip times for packets.

One approach to maintaining an SER budget, despite the loss of a bit-lane, is to add a spare bit-lane to the memory channel. This spare bit-lane can be held in reserve and used for correction data if another bit-lane fails. For example, a fifteenth bit-lane can be added to a memory channel that normally includes fourteen bit-lanes. This fifteenth bit-lane can be used for correction data (such as CRC data) should one of the original fourteen bit-lanes fail.

The spare bit-lane approach, however, includes a number of disadvantages. Additional bit-lanes add complexity to a memory system and also increase the cost and the amount of power used by the memory system. Hence, alternative solutions that can maintain memory channel reliability without requiring spare bit-lanes are very desirable.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

Embodiments of the invention are generally directed to systems, apparatuses, and methods for mitigating silent data corruption in a buffered memory module system. The term "buffered memory module" refers to a technology in which the signaling interface between a memory controller and the memory devices is (at least partly) split into two independent signaling interfaces with a buffer between them (see, e.g., FIG. 1). The memory modules may have a dual inline memory module (DIMM) form factor and, in such cases, the technology is typically called fully-buffered DIMM (FB-DIMM) technology. Selected embodiments of the invention are described below with reference to FB-DIMM technology. It is to be appreciated, however, that in alternative embodiments the buffered memory modules may have a different form factor.

In one embodiment, a memory system is capable of surviving (e.g., continuing to function) if either a read channel bit-lane fails or a memory device fails. The system need not, however, survive the simultaneous occurrence of both faults. As is further described below, the silent error rate (SER) budget for the system may be substantially maintained by selectively using the strong error detection capability of an ECC in combination with the error detection of an N-bit CRC to retry faulty data.

Figure 1:
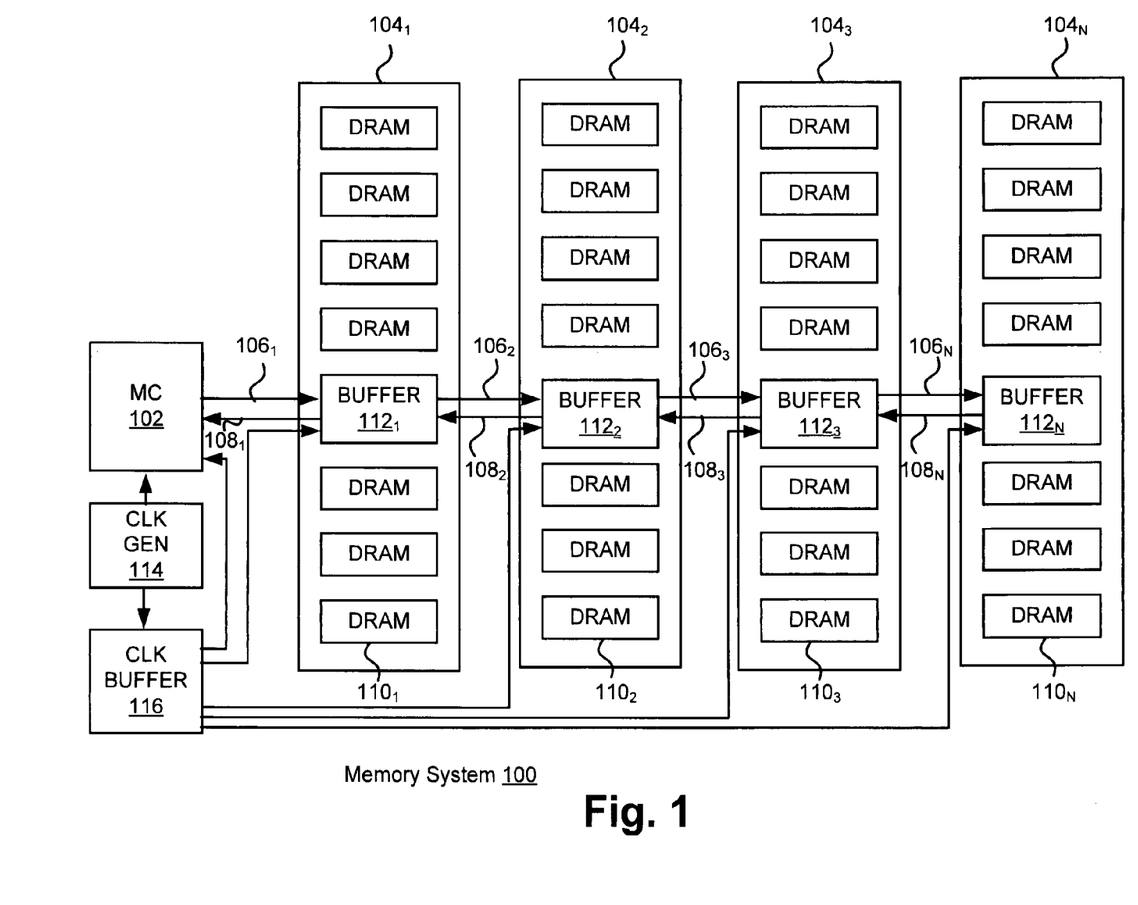
FIG. 1 is a high-level block diagram of a memory system implemented according to an embodiment of the invention.

FIG. 1 is a high-level block diagram of a memory system implemented according to an embodiment of the invention. In one embodiment, one or more memory modules $104_1$-$104_N$ are based on printed circuit boards having fingers along both sides of one edge to create a DIMM that may be plugged into a connector on another circuit board that holds other components of the system. Modules $104_1$-$104_N$ are populated with memory devices $110_1$-$110_N$. In an embodiment, the memory devices are commodity-type dynamic random access memory (DRAM) such as Double Data Rate II (DDR2) DRAM. A memory buffer (e.g., memory buffers $112_1$-$112_N$) on each module isolates the memory devices from a channel that interfaces the modules to memory controller 102. In an embodiment, the channel is wired in a point-to-point arrangement with an outbound path that includes outbound links $106_1$-$106_N$, and an inbound path that includes inbound links $108_1$-$108_N$. In one embodiment, links 106 and 108 are implemented with parallel unidirectional bit-lanes using low-voltage differential signaling.

In the illustrated embodiment, no additional signal lines are used for functions such as command, reset, initialization, and the like. Instead, these functions are encoded directly in the data sent over the channel. In an alternative embodiment, any number of additional signal lines may be used to implement such functions.

Clock generator 114 generates a reference clock signal which is distributed to memory controller 102 and memory modules 104 through clock buffer 116. This facilitates a quasi-synchronous (mesochronous) clocking scheme in which locally generated clock signals are used to sample and redrive incoming data. In an embodiment, the data signals may be clocked without any frequency tracking because a common reference clock is available at each agent. In an alternative (plesiochronous) embodiment, a local clock signal may be generated independently of any common reference clock. In yet another alternative embodiment, a synchronous clocking scheme such as source synchronous strobing may be used.

In operation, memory controller 102 initiates data transfers by sending data to the innermost memory module 104 on the outbound path. The data may be organized into, for example, packets or frames (terms used interchangeable here). The innermost memory module 104 receives and redrives the data to the next memory module (e.g., $104_2$) on the outbound path. Each memory module 104 receives and redrives the outbound data until it reaches the outermost memory module (e.g., $104_N$). In an embodiment, each memory module 104 may be capable of detecting (or being instructed) that it is the outermost memory module. In such an embodiment, the outmost memory module $104_N$ may disable any redrive circuitry to reduce unnecessary power consumption, noise, etc. In one embodiment, data transfers in the direction of the memory controller (e.g., the northbound or read direction) are initiated by the outermost memory module $104_N$. In such an embodiment, each memory module 104 receives and redrives inbound data along the inbound path until it reaches memory controller 102.

Any suitable communication protocol may be used over the physical channel. For example, memory controller 102 may initiate and schedule all inbound and outbound data transfers. Alternatively, any agent may be allowed to initiate data transfers. Frames of data may be configured to carry commands, read data, write data, status information, error information, initialization information, idle patterns, etc., or any combination thereof. A protocol may be implemented such that, when memory controller 102 sends a command frame to a target memory module 104 along the outbound path, the target memory module 104 responds by immediately sending a response frame back to memory module 104 along the inbound path. In such an embodiment, the target memory module 104 does not redrive the command frame on the outbound path.

In an alternative embodiment, the target module receives the command frame and then redrives the command frame on the outbound path. When the outermost memory module $104_N$ receives the command frame, it initiates a response frame (e.g., an idle frame) on the inbound path. The target memory module 104 then merges its response into the inbound data stream, for example, by replacing the response frame sent by the outermost module $104_N$ with the target memory module's 104 true response frame.

Figure 2:
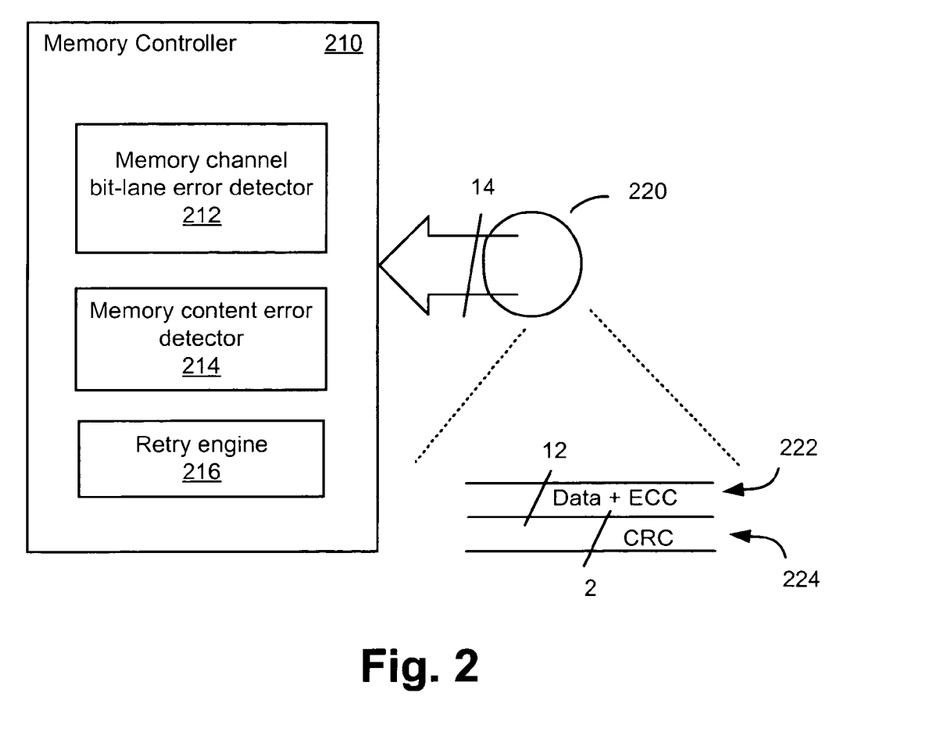
FIG. 2 is a block diagram of a memory controller, implemented according to an embodiment of the invention.

FIG. 2 is a block diagram of memory controller 210, implemented according to an embodiment of the invention. Memory controller 210 includes memory channel bit-lane error detector 212, memory content error detector 214, and retry engine 216. The term "agent" broadly refers to a functional element of memory controller 210. In an alternative embodiment, memory controller 210 includes more agents, fewer agents, and/or different agents.

Memory channel 220 is the read channel (e.g., northbound channel) of a FB-DIMM memory system. Memory channel 220 may be composed of one or more unidirectional links (e.g., links 108, shown in FIG. 1). In an embodiment, memory channel 220 has 14 bit-lanes. The term "bit-lane" refers to, for example, a circuit trace (or other interconnect) to convey digital information. Twelve of the fourteen bit-lanes may be used to convey data and ECC information as shown by 222. The remaining two bit-lanes may be used for CRC information as shown by 224. In an alternative embodiment, memory channel 220 has more bit-lanes or fewer bit-lanes than those shown in FIG. 2.

In an embodiment, memory channel bit-lane error detector 212 provides both an M-bit CRC and an N-bit CRC. M and N refer to the degree of the polynomial used by the CRC and N is less than M. That is, an N-bit CRC uses a polynomial having a lower degree than an M-bit CRC. As is further described below, the N-bit CRC is used when at least one bit-lane of memory channel 220 has failed. As used herein, CRC refers not only to a cyclical redundancy check but also to any other type of error checking scheme used to verify the integrity of a frame or of a pattern (e.g., a pattern to test the integrity of a memory channel). In addition, memory channel bit-lane error detector 212 includes logic to detect a bit-lane failure. Memory channel bit-lane error detector 212 is further discussed below with reference to FIG. 3A.

Memory content error detector 214 detects and, in some cases, corrects errors in data received from memory channel 220. In one embodiment, memory content error detector 214 is an implementation of an error correction code (ECC). As is further discussed below, with reference to FIGS. 3-5, the strong error detection capability of the ECC is used in combination with the N-bit CRC to signal the need to resend faulty data, if at least one bit-lane fails (e.g., one of bit-lanes of memory channel 220).

In an embodiment, retry engine 216 is an agent that enables memory controller 210 to selectively signal the need to resend faulty data. That is, retry engine 216 can selectively signal the need to resend faulty data from a memory module (e.g., memory module 104, shown in FIG. 1) to memory controller 210.

Figure 3A:
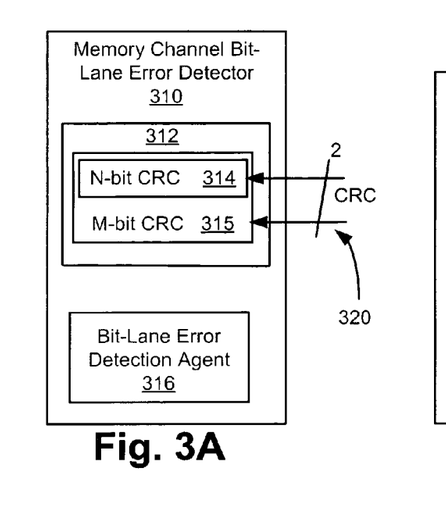
FIG. 3A is a block diagram showing selected aspects of a memory channel bit-lane error detector, implemented according to an embodiment of the invention.

FIG. 3A is block diagram showing selected aspects of memory channel bit-lane error detector 310, according to an embodiment of the invention. Memory channel bit-lane error detector 310 includes error detection agent 312 and bit-lane error detection agent 316. In an embodiment, error detection agent 312 includes M-bit CRC 315 and N-bit CRC 314. In an alternative embodiment, memory channel bit-lane error detector 310 may include more agents, fewer agents, and/or different agents.

M-bit CRC 315 and N-bit CRC 314 are coupled with memory channel 320 to receive data from one or more fully-buffered memory modules (e.g., memory modules 104, shown in FIG. 1). In one embodiment, memory channel 320 is composed of one or more unidirectional links (e.g., links 108, shown in FIG. 1). In such an embodiment, memory channel 320 may represent the inbound (or, northbound) links on the memory channel.

The portion of memory channel 320 illustrated in FIG. 3A includes two bit-lanes that are used to convey CRC information. In a normal operating mode (e.g., when all bit-lanes of the memory channel are functioning), memory channel bit-lane error detector 310 receives data from both CRC bit-lanes of memory channel 320. If both CRC bit-lanes are available, then memory channel bit-lane error detector 310 applies M-bit CRC 315 to detect memory content errors in data received from memory channel 320.

In one embodiment, the memory system (e.g., memory system 100, shown in FIG. 1) supports a bit-lane failover mode. Bit-lane failover refers to selectively redirecting data to route the data around a failed bit-lane. The term "bit-lane failover mode" refers to a mode of operation for the memory system when at least one bit-lane has failed.

In an embodiment, one of the CRC bit-lanes is used to transport data when the system is in bit-lane failover mode. Error detection agent 312 applies N-bit CRC 314 instead of M-bit CRC 315, when the system is in bit-lane failover mode, because memory channel 320 has a reduced capacity to carry CRC information. In one embodiment, M-bit CRC 315 is a 12-bit CRC. Similarly, N-bit CRC 314 may be a 6-bit CRC.

In one embodiment, N-bit CRC 314 and M-bit CRC 315 are CRC codes that are designed to be used with an FB-DIMM memory architecture. Some CRC codes designed for use with FB-DIMM memory channels (referred to as X-bit CRCs for ease of reference) can detect all 1-bit and 2-bit faults anywhere within a data packet received from the memory channel. In addition, some of these X-bit CRCs can detect any continuous X-bit fault along the code path. A 3-bit or larger fault that spans more than one continuous X-bit data string in the code path will have a 1-in-$2^X$ chance of not being detected by an X-bit CRC. Hence, a 12-bit CRC would be 64 times more capable of detecting a catastrophic multi-bit fault than a 6-bit CRC.

Figure 3B:
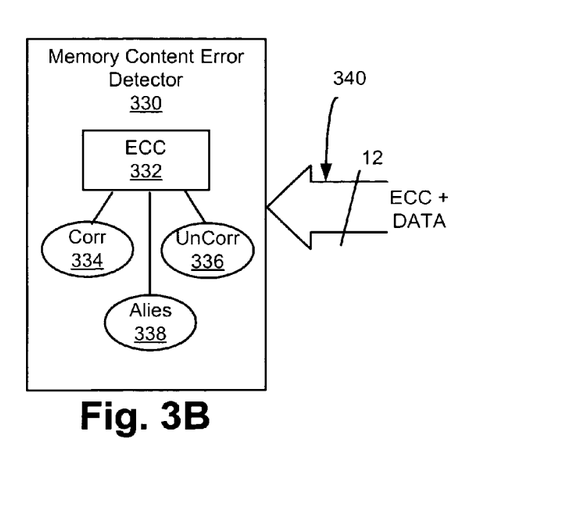
FIG. 3B is a block diagram showing selected aspects of a memory content error detector, implemented according to an embodiment of the invention.

FIG. 3B is a block diagram showing selected aspects of a memory content error detector, implemented according to an embodiment of the invention. Memory content error detector 330 may implement, at least in part, an error correction code (ECC) 332. For example, in an embodiment in which memory channel 340 is a 14-bit memory channel, ECC 332 may be a 16-bit ECC. In one embodiment, ECC 332 is an implementation of a Hamming style code. In an alternative embodiment, a different ECC may be used.

ECC 332 detects and, in some cases, corrects errors in data that is received from memory channel 340. For example, in an embodiment, ECC 332 is a single error correct-double error detect (SEC-DED) code that can correct any 1-faulty bit in a code word and can detect any 2-faulty bits in the code word. In an alternative embodiment, ECC 332 implements b-bit chipdisable (or single-device-disable-code (SDDC)) error correction code (e.g., SbEC-DED code). A SbEC-DED chipdisable code can correct all b-faults on one b-bit DRAM and can also detect two single bit faults on any two different DRAMs. Both the SEC-DED Hamming code and the SbEC-DED chipdisable code have very strong error detection beyond the 100% double error detection. For example, analysis of common SbEC-DED chipdisable codes using sixteen redundant syndrome bits to guard 128 bits of data indicates that it has a catastrophic error detection capacity that exceeds the error detection capacity of a 13-bit CRC code.

In operation, ECC 332 receives a data packet (e.g., data and ECC information) from memory channel 340 and indicates whether or not it detects an error in the received data. If it does detect an error, ECC 332 may identify the packet as having a correctable error 334 or an uncorrectable error 336. The terms ECC-correctable and ECC-uncorrectable respectively refer to correctable and uncorrectable errors detected by ECC 332.

The error indication provided by ECC 332 is not always correct. The reason for this is that error correction codes (e.g., ECC 332) are designed (often through a specification) to detect and correct errors having certain mathematical error weights. If ECC 332 receives data having an error that exceeds the error weight for which ECC 332 is specified, then the error indication provided by ECC 332 could be incorrect. The term "alias" (e.g., alias 338) refers to an error indication provided by an ECC (e.g., ECC 332) that is incorrect.

Figure 4:
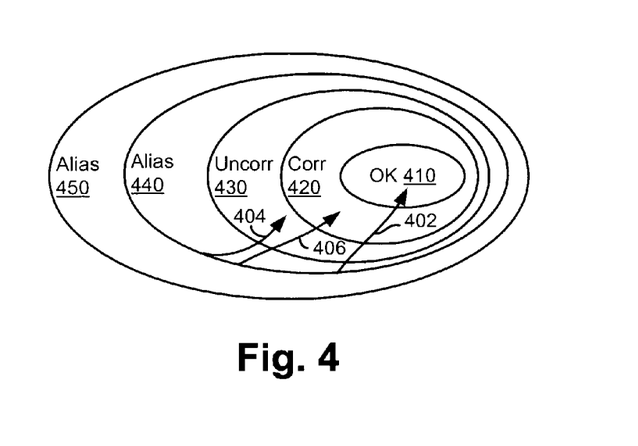
FIG. 4 is a conceptual diagram illustrating error indications associated with an error correction code (ECC).

FIG. 4 is a conceptual diagram illustrating error indications from an error correction code. Regions 410-430 illustrate cases in which the data received at an ECC does not contain errors having error weights in excess of the ECC's specification. Alias regions 440 and 450, however, represent instances in which an ECC provides an error indication that might be incorrect because the data contains an error that exceeds the ECC's specified capabilities.

Aliases 440 are aliases that are generated when all of the bit-lanes of a memory channel (e.g., memory channel 220, shown in FIG. 2) are operational. Aliases 450 illustrate aliases that are generated when at least one bit-lane of the memory channel has failed. As discussed above, a reduction in the number of bit-lanes corresponds to an increase in a system's exposure to error. Thus, the scope of aliases 450 is greater than the scope of aliases 440 because aliases 450 illustrates aliases that occur when at least one bit-lane has failed.

If an alias occurs, the incorrect indication provided by the ECC can take a number of different forms. For example, the ECC may indicate that the data is valid when it includes an error as shown by 402. Also, the ECC may indicate that it has detected an uncorrectable error (e.g., as shown by 404) when, in fact, there is no error or the error is correctable. Similarly, the ECC may indicate a correction for a correctable error but the indicated correction may be wrong and/or there may not be a correctable error as shown by 406.

Figure 5A:
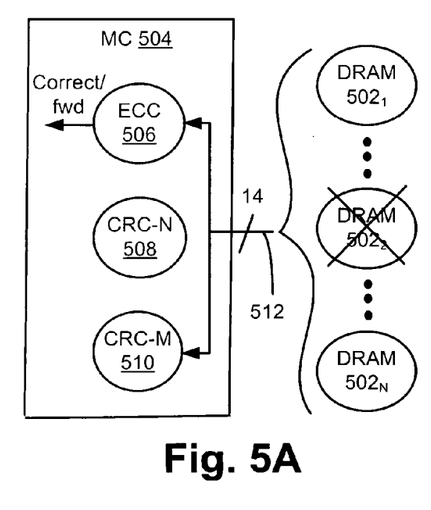
FIGS. 5A and 5B are block diagrams illustrating the selective use of the strong error detection capability of an ECC in combination with an N-bit cyclic redundancy check (CRC) to resend faulty data, when a memory system is in bit-lane failover mode.
Figure 5B:
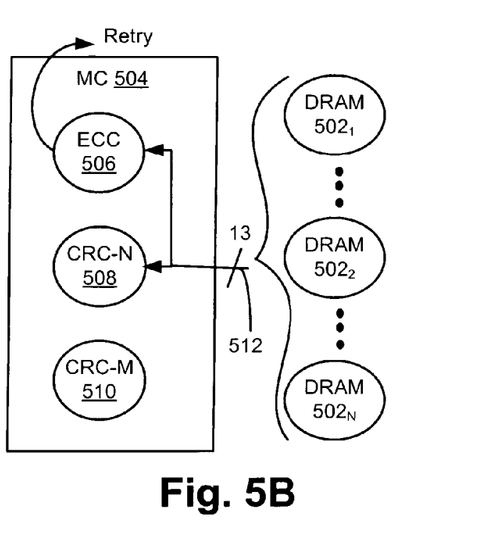

FIGS. 5A and 5B are block diagrams illustrating the selective use of the strong error detection capability of an ECC in combination with an N-bit CRC to resend faulty data, when a memory system is in bit-lane failover mode. FIG. 5A illustrates selected aspects of a memory system when all of the bit-lanes of a memory channel are operational and FIG. 5B illustrates selected aspects of the memory system when at least one bit-lane of the memory channel has failed.

Referring to FIG. 5A, DRAMs 502 send data to memory controller 504 via memory channel 512. In an embodiment, memory controller 504 includes a number of agents including ECC 506, N-bit CRC 508, and M-bit CRC 510. As described above N and M refer to the degree of the polynomial used by the CRC and N is less than M. That is, N-bit CRC 508 uses a polynomial having a lower degree than M-bit CRC 510. In an embodiment, memory controller 504 uses M-bit CRC 510 if the system is not in bit-lane fail-over mode because it provides stronger error detection than N-bit CRC 508.

Figure 6:
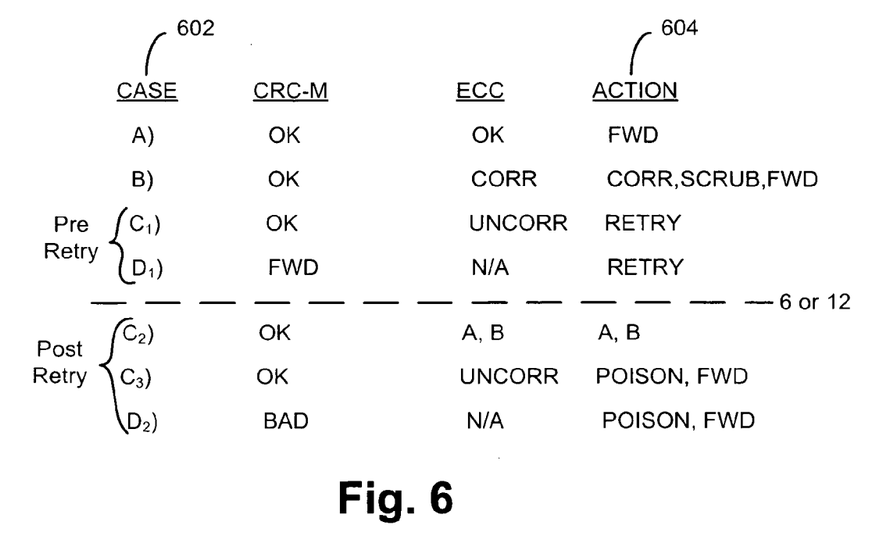
FIG. 6 illustrates selected aspects of using an ECC in combination with a CRC.

When not in bit-lane failover mode, memory controller 504 employs ECC 506 in combination with M-bit CRC 510 to detect (and possibly correct) errors in data received from memory channel 512. FIG. 6 illustrates selected aspects of using ECC 506 in combination with CRC 510. Column 602 lists selected cases for the combined use of ECC 506 and CRC 510 and column 604 lists actions that correspond to each case. In case A, for example, both CRC 510 and ECC 506 indicate that the data is valid. The valid data is forwarded to, for example, a processor (not shown). In case B, ECC 506 indicates that the data contains a correctable error. The corresponding action is to correct the error (e.g., through a scrub process that occurs in memory) and to forward the corrected data (e.g., to a processor). Cases C1 and D1 illustrate cases in which the corresponding action is to resend the data. After the data is resent, it is checked a second time with a combination of ECC 506 and CRC 510. Cases C2, C3, and D2 illustrate selected cases after the data has been resent. As discussed below, with reference to FIG. 5B, whether data is resent depends, in part, on whether the system is in bit-lane failover mode.

Referring again to FIG. 5B, DRAMs 502 send data to memory controller 504 via memory channel 512. In contrast to FIG. 5A, however, at least one bit-lane of memory channel 512 has failed in FIG. 5B. Since at least one bit-lane has failed, CRC 508 is used rather than CRC 510 because memory channel 512 has a reduced capacity to support CRC information. Therefore, a combination of ECC 506 and CRC 508 is used to detect and possibly correct an error in the received data.

Figure 7:
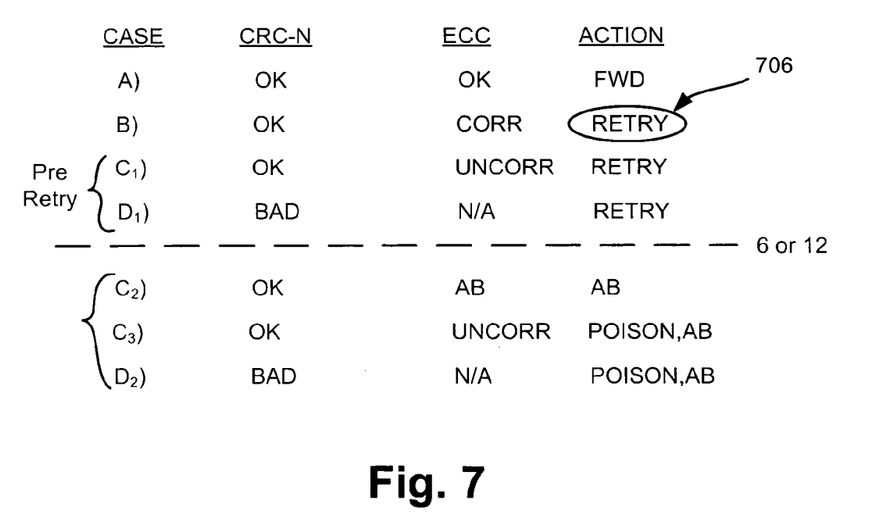
FIG. 7 illustrates selected aspects of checking and correcting memory content errors, according to an embodiment of the invention.

FIG. 7 illustrates selected aspects of checking and correcting memory content errors, according to an embodiment of the invention. In an embodiment, cases A, C1-C3, and D1-D2 correspond to actions that are substantially the same as the actions shown in column 604 of FIG. 6. In one embodiment, however, the action corresponding to case B varies depending on whether the system is in bit-lane failover mode.

Case B refers to the case in which CRC 508 indicates that the received data does not contain an error but ECC 506 indicates that the data does contain a correctable error. Recall that CRC 508 uses a lower degree polynomial than CRC 510. For example, in an embodiment, CRC 508 is a 6-bit CRC and CRC 510 is a 12-bit CRC. Since a CRC-6 has a 1-in-64 chance of not detecting a rare catastrophic multi-bit fault, and ECC 506 has a 1-in-8,192 chance of not detecting a rare catastrophic fault, data packets that reach memory controller 504 showing either a CRC6 fault or an ECC fault would get a large advantage in reliability by having the data resent upon the ECC detection. The reason for the large reliability advantage is that the probability of uncorrectable errors masquerading (aliasing) as correctable ECC errors is significantly higher when at least one bit-lane has failed. Hence, in an embodiment, even logically correctable ECC errors are resent when using CRC-6 as shown by 706.

Figure 8:
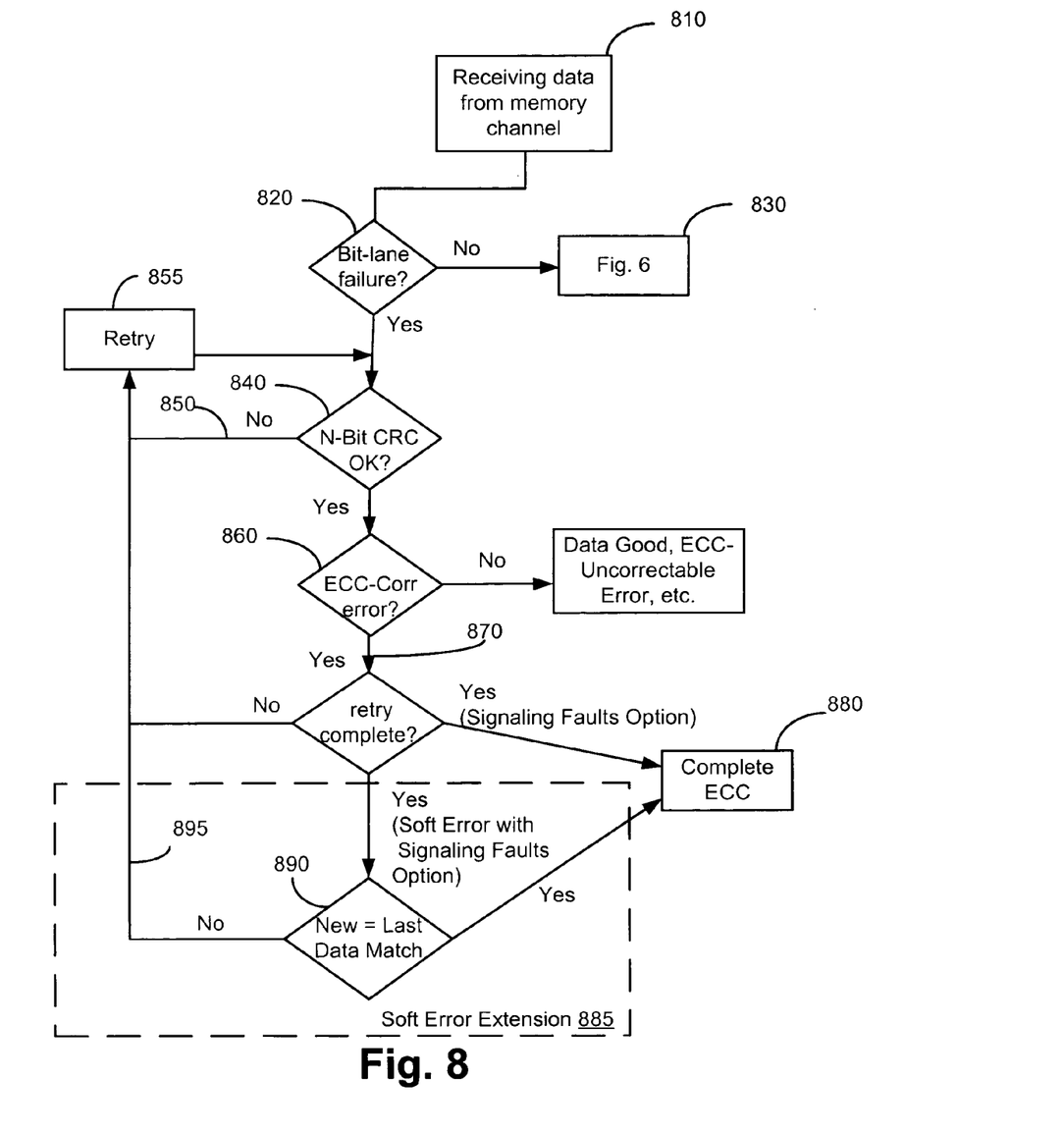
FIG. 8 is a flow diagram illustrating certain aspects of a method for mitigating silent data corruption according to an embodiment of the invention.

Turning now to FIG. 8, the particular methods associated with embodiments of the invention are described in terms of computer software and hardware with reference to a flow-chart. The methods to be performed by a computing device may constitute state machines or computer programs made up of computer-executable instructions. The computer-executable instructions may be written in a computer programming language or may be embodied in firmware logic. If written in a programming language conforming to a recognized standard, such instructions can be executed on a variety of hardware platforms and for interface to a variety of operating systems. In addition, embodiments of the invention are not described with reference to any particular programming language. It will be appreciated that a variety of programming languages may be used to implement embodiments of the invention as described herein. Furthermore, it is common in the art to speak of software, in one form or another (e.g., program, procedure, process, application, etc.), as taking an action or causing a result. Such expressions are merely a shorthand way of saying that execution of the software by a computing device causes the device to perform an action or produce a result.

FIG. 8 is a flow diagram illustrating certain aspects of a method for mitigating silent data corruption according to an embodiment of the invention. Referring to process block 810, a memory controller (or other agent) receives data from a memory channel at 810. In an embodiment, the memory channel is an FB-DIMM memory channel. For example, the memory channel may be a 14-bit FB-DIMM memory channel.

Referring to process block 820, the memory controller determines whether a bit-lane failure has occurred. In one embodiment, the memory controller selectively applies an M-bit CRC or an N-bit CRC depending on whether the system is in bit-lane failover mode. For example, a 12-bit CRC may be applied if all bit-lanes of the memory channel are operational and a 6-bit CRC may be applied if at least one bit-lane has failed.

The memory controller may include a bit-lane error detector (e.g., bit-lane error detector 316, shown in FIG. 3A). The bit-lane error detector may test the memory channel under various conditions (and/or based on certain policies). In one embodiment, the bit-lane error detector tests for a failed bit-lane in connection with resending data. For example, the bit-lane error detector may test for a failed bit-lane if one or more of the following conditions are detected: CRC error; CRC valid and uncorrectable ECC error; CRC valid and suspected aliased correctable ECC error (which is treated as an uncorrectable ECC error); faulty (e.g., unexpected idle packet) write acknowledge; and/or CRC valid and correctable ECC error when running in CRC-N (e.g., CRC-6) mode. In an embodiment, the bit-lane error detector tests for a failed bit-lane by attempting to retrain the links of the memory channel. The error detector may identify a failed bit-lane by determining which bit-lanes cannot be retrained. In an alternative embodiment, the memory controller may use a different mechanism to identify a failed bit-lane.

If there is not a bit-lane failure, then the error detection and error correction shown in FIG. 6 may be applied to the data as shown by 830 (e.g., 12-bit CRC and ECC). If, however, a bit-lane has failed the memory controller applies an N-bit CRC (rather than an M-bit CRC) as shown by 840. If the N-bit CRC detects an error (e.g., detects a possible signaling fault), the data is resent from memory to the memory controller as shown by 850. In an embodiment, the links of the memory channel are retrained prior to retrying the read operation. In many cases, a signaling fault can be resolved by retraining the links. Thus, there is a low probability that the "new" data obtained after the retry operation (855) has an error caused by the same catastrophic signaling fault. The memory controller employs an ECC to check for errors at 860.

As described above (e.g., with reference to FIG. 7) the ECC may provide a number of different indications including whether the data contains an ECC-correctable error. Since the memory controller is operating in bit-lane failover mode, however, there is an elevated probability that the uncorrectable error is masquerading (aliasing) as an ECC-correctable error. This elevated risk is, at least in part, a result of the reduced error detection provided by the N-bit CRC as compared to the M-bit CRC. In an embodiment, the memory controller mitigates the risk of silent data corruption by retrying the ECC-correctable error (when in bit-lane failover mode) as shown by 870. The phrase "retrying the ECC-correctable error" refers to resending the data from the memory devices to the memory controller.

The "new" data packet (obtained after the retry operation) is checked by the N-Bit CRC (840) (e.g., to detect signaling faults) and, if the N-bit CRC does not detect a fault, then the data is checked by the ECC (860). The probability that the N-Bit CRC will miss a signaling fault in both the "new" data packet and the initial data packet is very low. Therefore, in one embodiment, if the ECC detects an ECC-correctable error after the retry, the ECC check is completed at 880.

In an alternative embodiment (as shown by 885), the memory controller may be able to detect either of the following fault combinations: a signaling fault in both the "new" data packet and the previous data packet; and/or a combination of a signaling fault with a soft error. In such an embodiment, the "new" data packet (obtained after the retry operation) is compared (at least partly) with the data packet from the preceding read operation at 890. If the "new" data packet matches the previously transmitted data packet, then no signaling fault occurred, and the ECC logic (e.g., 506) can be used as normal to separate correctable or uncorrectable faults (880), and complete the proper operation on the data. If the "new" data does not match the previously transmitted data, then a signaling fault occurred in one of the two transmissions, and another retry operation is performed (895) until the data from two sequential transmissions match.

In conventional memory systems (e.g., conventional FB-DIMM memory systems) without a bit-lane failure, ECC-correctable errors are not retried to check for signaling faults because the longer M-bit CRC provides signaling error detection similar to or better than that of the ECC, and retrying ECC-correctable soft errors or DRAM failures with a SbEC-DED ECC would waste memory bandwidth and reduce system performance. Embodiments of the invention, however, are implemented to survive either a bit-lane failure or the failure of a DRAM device but not necessarily both at the same time. Therefore, embodiments of the invention, selectively retry the ECC-correctable error until data from two sequential transmissions are identical when in bit-lane failover mode to reduce the system's exposure to silent data corruption due to signaling faults.

Figure 9A:
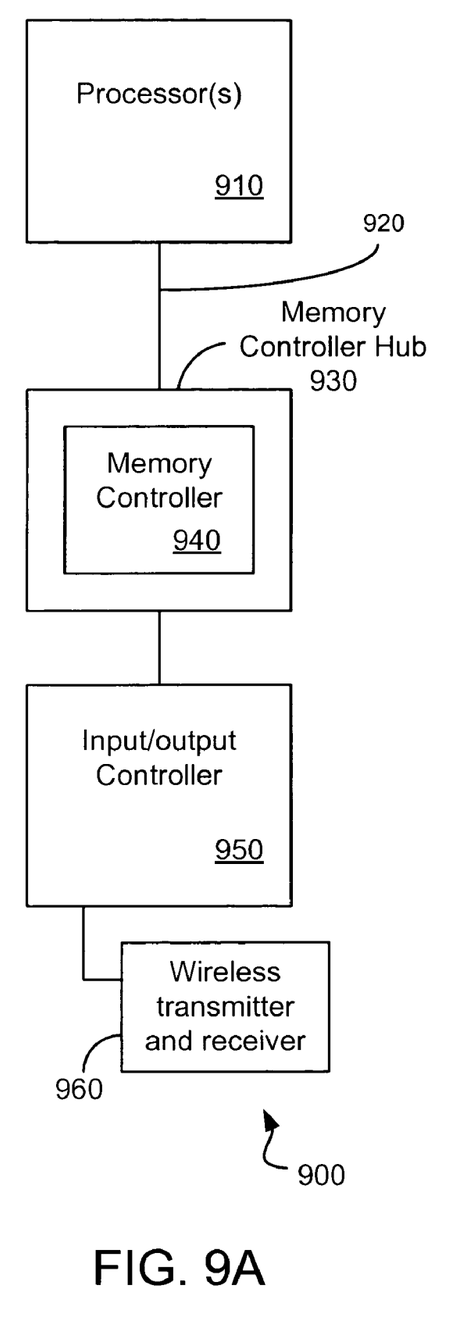
FIG. 9A is a block diagram showing a computer system with a memory controller according to an embodiment of the invention.
Figure 9B:
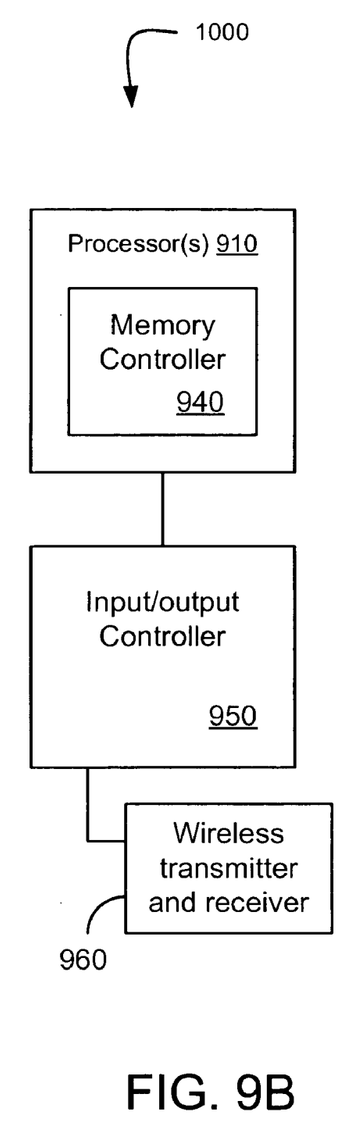
FIG. 9B is a block diagram showing a computer system with a memory controller according to another embodiment of the invention.

FIGS. 9A and 9B are block diagrams illustrating, respectively, selected aspects computing systems 900 and 1000. Computing system 900 includes processor 910 coupled with an interconnect 920. In some embodiments, the term processor and central processing unit (CPU) may be used interchangeably. In one embodiment, processor 910 is a processor in the XEON® family of processors available from Intel Corporation of Santa Clara, Calif. In an alternative embodiment, other processors may be used. In yet another alternative embodiment, processor 910 may include multiple processor cores.

According to one embodiment, interconnect 920 communicates with memory controller hub 930. In one embodiment, memory controller hub 930 is a component of a chipset. Interconnect 920 may be a point-to-point interconnect or it may be connected to two or more chips (e.g., of the chipset). Memory controller hub 930 includes memory controller 940 which may be coupled with main system memory (e.g., as shown in FIG. 1). In an alternative embodiment, memory controller 940 may be on the same chip as processor 910 as shown in FIG. 9B.

Input/output (I/O) controller 950 I/0 controls the flow of data between processor 910 and one or more I/O interfaces (e.g., wired and wireless network interfaces) and/or I/O devices. For example, in the illustrated embodiment, I/O controller 950 controls the flow of data between processor 910 and wireless transmitter and receiver 960. In an alternative embodiment, memory controller 940 and I/O controller 950 may be integrated into a single controller.

Elements of embodiments of the present invention may also be provided as a machine-readable medium for storing the machine-executable instructions. The machine-readable medium may include, but is not limited to, flash memory, optical disks, compact disks-read only memory (CD-ROM), digital versatile/video disks (DVD) ROM, random access memory (RAM), erasable programmable read-only memory (EPROM), electrically erasable programmable read-only memory (EEPROM), magnetic or optical cards, propagation media or other type of machine-readable media suitable for storing electronic instructions. For example, embodiments of the invention may be downloaded as a computer program which may be transferred from a remote computer (e.g., a server) to a requesting computer (e.g., a client) by way of data signals embodied in a carrier wave or other propagation medium via a communication link (e.g., a modem or network connection).

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of embodiments of the invention, various features are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed subject matter requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

What is claimed is:

1. An apparatus comprising:
a memory content error detector coupled with a buffered memory module channel to receive data from the buffered memory module, to apply an error detection code to the received data on each bit-lane of the buffered memory module channel, and to detect an error on a bit-lane, the memory content error detector having an M-bit cyclic redundancy check (CRC) component and an N-bit CRC component, wherein the N-bit CRC component is to be selected if at least one bit-lane fails, and wherein the buffered memory module channel includes at least one additional bit-lane to convey CRC information without having to append CRC characters to the data;

the memory content error detector to detect errors in the received data, to correct errors in the received data if it is determined that the error is correctable and that there is no error on a bit-lane, and to indicate whether data received from the buffered memory module channel contains a correctable error; and a retry engine coupled with the memory content error detector, the retry engine capable of signaling a data retry on the buffered memory module channel if at least one bit-lane of the buffered memory module channel fails and the memory content error detector indicates a correctable error.

2. The apparatus of claim 1, wherein the memory device is a dynamic random access memory (DRAM) device.

3. The apparatus of claim 1, wherein the M-bit CRC component is a twelve-bit CRC component and the N-bit CRC component is a six-bit CRC component.

4. The apparatus of claim 1, wherein the second hardware component is, at least in part, an error correction code (ECC) component.

5. The apparatus of claim 4, wherein the ECC component is configured as a single b-bit error correcting-double bit error detecting (SbEC-DED) ECC component.

6. The apparatus of claim 5, wherein the buffered memory module channel is a fourteen-bit buffered memory module channel.

7. The memory controller of claim 1, wherein the memory content error detector comprises a first higher accuracy error detection component and a second lower accuracy error detection component, and wherein the error detector uses the first error detection component to detect an error on a bit-lane and the second error detection component to determine a data error if a bit-lane error is detected.

8. The memory controller of claim 7, wherein the memory content error detector enters a bit-lane failover mode if a bit-lane error is detected and for subsequent received data uses the second error detection component when in bit-lane failover mode.

9. The memory controller of claim 7, wherein the first and second error detection components are polynomial based and the first error detection component uses a higher degree polynomial than the second error detection component.

10. The memory controller of claim 9, wherein the first and second error detection components are both based on cyclic redundancy check and wherein the first error detection component uses a higher number of bits.

11. The memory controller of claim 10, wherein the first error detection component uses more bit-lanes than the second error detection component.

12. The memory controller of claim 7, wherein the retry engine does not signal a data retry if the memory content error detector determines that the error is correctable, that there is an error on a bit-lane there is no error using the second error detection component.

13. The memory controller of claim 1, wherein error detection bits for the memory content error detector are received on auxiliary bit-lanes of the memory module data channel that do not carry data.

14. A system comprising:
a buffered memory module to store data and allow read and write access;
a buffered memory module channel coupled to the memory module to receive data from the buffered memory module;
a memory device coupled with the buffered memory module channel to receive data from the buffered memory module;
a memory channel bit-lane error detector coupled with the buffered memory module channel, to apply an error detection code to the received data on each bit-lane of the buffered memory module channel, and to detect an error on a bit-lane, the memory channel bit-lane error detector having an M-bit Cyclic redundancy check (CRC) component and an N-bit CRC component, wherein the N-bit CRC component is to be selected if at least one bit-lane of the buffered memory module channel fails, and wherein the buffered memory module channel includes at least one additional bit-lane to convey CRC information without having to append CRC characters to the data;
a memory content error detector coupled with the buffered memory module channel, the memory content error detector to receive data from the memory module, to detect errors in the received data, to correct errors in the received data if the error is correctable and if the bit-lane error detector indicates that there is no error on a bit-lane, and to indicate whether data received from the buffered memory module channel contains a correctable error; and
a retry engine coupled with the memory content error detector, the retry engine capable of signaling a data retry if at least one bit-lane of the buffered memory module channel fails and the memory content error detector indicates a correctable error.

15. The system of claim 14, wherein the memory device is a dynamic random access memory device (DRAM) device.

16. The system of claim 15, wherein the DRAM device is a Synchronous DRAM device.

17. The system of claim 14, wherein the M-bit CRC component is a twelve-bit CRC component and the N-bit CRC component is a six-bit CRC component.

18. The system of claim 17, wherein the buffered memory module channel is a fourteen bit buffered memory module channel.

19. The system of claim 18, wherein the ECC component is configured as a sixteen-bit ECC component.

20. The system of claim 14, wherein the memory channel bit-lane error detector, the memory content error detector, and the retry engine are integrated into a memory controller.

21. The system of claim 14, wherein the memory channel bit-lane error detector, the memory content error detector, and the retry engine are integrated into a memory controller.

22. The system of claim 14, wherein the bit-lane error detector comprises a first higher accuracy error detection component and a second lower accuracy error detection component, and wherein the error detector uses the first error detection component to detect an error on a bit-lane and the second error detection component to determine a data error if a bit-lane error is detected.

23. The system of claim 22, wherein the first error detection component is a twelve-bit CRC component and the second error detection component is a six-bit CRC component.

24. The system of claim 22, wherein the bit-lane error detector enters a bit-lane failover mode if a bit-lane error is detected and for subsequent received data uses the second error detection component when in bit-lane failover mode.

25. The system of claim 14, wherein error detection bits for the bit-lane error detector are received on an auxiliary bit-lanes of the memory module data channel that do not carry data.

26. The system of claim 14, wherein the retry engine is further coupled to the content error detector and further causes the memory controller not to retry receiving the data on the bit-lanes if the content error detector determines that the error is correctable, if the bit-lane error detector indicates that there is an error on a bit-lane using and if the bit lane error detector indicates that there is no error using the second error detection component.

27. An apparatus comprising:
   means for receiving data from a memory module through bit-lanes of a memory module data channel, the means for receiving data having an M-bit cyclic redundancy check (CRC) component and an N-bit CRC component, wherein the N-bit CRC component is to be selected if at least one bit-lane of the buffered memory module channel fails, and wherein the buffered memory module channel includes at least one additional bit-lane to convey CRC information without having to append CRC characters to the data;
   means for applying an error detection code to the received data on each bit-lane to detect an error on a bit-lane;
   means for detecting errors in the received data and for correcting errors in the received data if the means for detecting determines that the error is correctable and if the means for applying indicates that there is no error on a bit-lane; and
   means for causing the means for receiving to retry receiving the data on the bit-lanes if the bit-lane error detector indicates an error on a bit-lane.

* * * * *